US008885128B2

(12) United States Patent
Kwack et al.

(10) Patent No.: US 8,885,128 B2
(45) Date of Patent: Nov. 11, 2014

(54) LIQUID CRYSTAL DISPLAY DEVICE AND METHOD FOR FABRICATING THE SAME

(71) Applicant: LG Display Co., Ltd., Seoul (KR)

(72) Inventors: Hee-Young Kwack, Gyeonggi-do (KR); Mun-Gi Park, Gyeonggi-do (KR); Jin-Hee Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 13/651,569

(22) Filed: Oct. 15, 2012

(65) Prior Publication Data

US 2013/0162926 A1     Jun. 27, 2013

(30) Foreign Application Priority Data

Dec. 21, 2011   (KR) .......................... 10-2011-0139042

(51) Int. Cl.
*G02F 1/1333*     (2006.01)
*G02F 1/1343*     (2006.01)

(52) U.S. Cl.
USPC .......................................... 349/138; 349/141

(58) Field of Classification Search
CPC .............. G02F 1/133345; G02F 2001/134372; G02F 1/134363
USPC ................................................. 349/138, 141
See application file for complete search history.

(56) References Cited

U.S. PATENT DOCUMENTS

| 2005/0007507 A1* | 1/2005 | Ono et al. ........................ 349/38 |
| 2007/0030423 A1* | 2/2007 | Ono et al. ...................... 349/106 |
| 2008/0002126 A1* | 1/2008 | Lim et al. ....................... 349/141 |
| 2008/0186440 A1* | 8/2008 | Lim et al. ....................... 349/141 |
| 2008/0287029 A1* | 11/2008 | Chang et al. ....................... 445/24 |
| 2011/0013130 A1* | 1/2011 | Choi et al. ....................... 349/141 |
| 2011/0085121 A1* | 4/2011 | Jeon et al. ...................... 349/141 |
| 2011/0109861 A1* | 5/2011 | Son et al. ....................... 349/141 |
| 2012/0038874 A1* | 2/2012 | Kim et al. ....................... 349/138 |
| 2013/0033666 A1* | 2/2013 | Chung et al. ................... 349/126 |

* cited by examiner

*Primary Examiner* — Dennis Y Kim
(74) *Attorney, Agent, or Firm* — Morgan, Lewis & Bockius LLP

(57) ABSTRACT

Disclosed are a liquid crystal display device which reduces the number of masks and improves an aperture ratio, and a method for fabricating the same. The liquid crystal display device includes gate and data lines perpendicularly intersecting on a substrate having pixel and pad parts; a thin film transistor on the substrate at the intersection of the gate and data lines; a pixel electrode on the substrate at the pixel part and connected directly to a drain electrode of the thin film transistor; an insulating film on the overall surface of the substrate including the pixel electrode and the thin film transistor; an organic film on the insulating film over the thin film transistor and the data line; and a common electrode of slit shapes overlapping the pixel electrode such that the insulating film is interposed between the common electrode and the pixel electrode.

4 Claims, 4 Drawing Sheets ns a broadcast signal and dis-ding the number of masks and to improve an

LIQUID CRYSTAL DISPLAY DEVICE AND METHOD FOR FABRICATING THE SAME

This application claims the benefit of Korean Patent Application No. 10-2011-0139042, filed on Dec. 21, 2011, which is hereby incorporated by reference as if fully set forth herein.

BACKGROUND OF THE INVENTION

1. Field of the Invention

The present invention relates to a liquid crystal display device, and more particularly, to a liquid crystal display device which reduces the number of masks and improves an aperture ratio, and a method for fabricating the same.

2. Discussion of the Related Art

As an information-oriented age has been developed, various requirements of display devices have been gradually increased, and in order to satisfy such increase, various flat display devices, such as liquid crystal display devices (LCDs), plasma display panels (PDPs), electro luminescent displays (ELDs), vacuum fluorescent displays (VFDs), etc., have been researched and some of these flat display devices are used now as display devices in various equipments.

From among the above flat display devices, liquid crystal display devices have been mostly used as mobile image display devices while replacing conventional cathode ray tubes (CRT) due to characteristics and advantages thereof, such as excellent image quality, light weight, thin profile and low power consumption, and have been developed as TVs and monitors of computers receiving a broadcast signal and displaying an image in addition to a mobile purpose, such as monitors of notebook computers.

Such a liquid crystal display device includes a color filter substrate on which a color filter array is formed, a thin film transistor substrate on which a thin film transistor array is formed, and a liquid crystal layer formed between the color filter substrate and the thin film transistor substrate.

As representative driving modes which are mostly used in liquid crystal display devices, there are a twisted-nematic (TN) mode in which liquid crystal directors are aligned to be twisted at an angle of 90° and are driven by applying voltage thereto, and an in-plane switching (IPS) mode in which liquid crystals are driven by a horizontal electric field between pixel electrodes and common electrodes aligned in parallel on one substrate.

In the IPS mode, pixel electrodes and common electrodes are alternately formed at an opening of a thin film transistor substrate, and liquid crystals are aligned by a horizontal electric field generated between the pixel electrodes and the common electrodes. An IPS mode liquid crystal display device has a wide viewing angle but has a low aperture ratio and low transmittance, and thus in order to improve such problems, a fringe field switching (FFS) mode liquid crystal display device has been proposed.

The FFS mode liquid crystal display device includes a common electrode of a single electrode shape formed at a pixel part and a plurality of pixel electrodes of slit shapes formed on the common electrode, or includes a pixel electrode of a single electrode shape and a plurality of common electrodes of slit shapes, thus operating liquid crystal molecules by a fringe field formed between the pixel and common electrodes.

Hereinafter, with reference to FIG. 1, a method for fabricating a general FFS mode liquid crystal display device will be described.

FIG. 1 is a cross-sectional view of a general liquid crystal display device.

With reference to FIG. 1, the method for fabricating the general FFS mode liquid crystal display device includes forming gate lines (not shown), gate electrodes 10a, gate pad lower electrodes (not shown), data pad lower electrodes (not shown) and common lines (not shown) on a lower substrate 10 using a first mask, forming a semiconductor layer 13 including an active layer 13a and an ohmic contact layer 13b using a second mask, forming source and drain electrodes 14a and 14b and data lines DL using a third mask, and forming first and second passivation films 15a and 15b having pixel contact holes, gate contact holes and data contact holes using a fourth mask.

The method for fabricating the general FFS mode liquid crystal display device further includes forming pixel electrodes 16 provided on the second passivation film 15b and connected to the drain electrodes 14b using a fifth mask, forming a third passivation film 15c exposing the gate pad lower electrodes (not shown) and the data pad lower electrodes (not shown) using a sixth mask, and forming common electrodes 17 generating a fringe field with the pixel electrodes 16 such that the third passivation film 15c is interposed between the common electrodes 17 and the pixel electrodes 16, gate pad upper electrodes (not shown) connected to the gate pad lower electrodes (not shown) and data pad upper electrodes (not shown) connected to the data pad lower electrodes (not shown) using a seventh mask.

The method for fabricating the general FFS mode liquid crystal display device further includes forming R, G and B color filters (not shown) and a black matrix 19 on an upper surface 20, and forming column spacers (not shown) to maintain a cell gap between the lower substrate 10 and the upper substrate 20, and thus the general liquid crystal display device is formed using 12 or more masks. Therefore, the fabricating process of the general liquid crystal display device is complicated and the manufacturing cost of the general liquid crystal display device is increased.

SUMMARY OF THE INVENTION

Accordingly, the present invention is directed to a liquid crystal display device and a method for fabricating the same.

One object of the present invention is to provide a liquid crystal display device which allows an organic film formed on a thin film transistor substrate to perform the function of a black matrix to reduce the number of masks and to improve an aperture ratio, and a method for fabricating the same.

To achieve this object and other advantages and in accordance with the purpose of the invention, as embodied and broadly described herein, a liquid crystal display device includes gate and data lines perpendicularly intersecting on a substrate having pixel and pad parts; a thin film transistor on the substrate at the intersection of the gate and data lines; a pixel electrode on the substrate at the pixel part and connected directly to a drain electrode of the thin film transistor; an insulating film on an entire surface of the substrate including the pixel electrode and the thin film transistor; an organic film on the insulating film over the thin film transistor and the data line; and a common electrode of slit shapes overlapping the pixel electrode such that the insulating film is interposed between the common electrode and the pixel electrode.

The organic film may include at least one selected from the group consisting of carbon, titanium oxide, a color pigment and a black resin.

The organic film may be formed of a photo active compound (PAC).

The pad parts may include a gate pad lower electrode connected to the gate line, a data pad lower electrode connected to the data line, and a gate pad upper electrode connected to the gate pad lower electrode and data pad upper electrode connected to the data pad lower electrode, wherein the gate and data pad upper electrodes are formed of the same layer as the common electrode.

In another aspect of the present invention, a method for fabricating a liquid crystal display device includes forming a gate line, a gate electrode and a gate pad lower electrode on a substrate using a first mask; forming a gate insulating layer on an entire surface of the substrate including the gate line, the gate electrode and the gate pad lower electrode; forming a semiconductor layer on the gate insulating layer over the gate electrode using a second mask; forming a pixel electrode on the gate insulating layer using a third mask; forming a data line and a data pad lower electrode on the gate insulating layer, and a source electrode and a drain electrode separated from the source electrode and connected directly to the pixel electrode on the semiconductor layer using a fourth mask, thereby forming a thin film transistor including the gate electrode and the source and drain electrodes; forming an insulating film on an entire surface of the substrate including the data line and the source and drain electrodes; forming an organic material layer on the insulating film over the thin film transistor and the data line using a fifth mask so that contact holes are formed on the gate and data pad lower electrodes; and forming a common electrode of slit shapes on the substrate to overlap with the pixel electrode using a sixth mask such that the insulating film is interposed between the common electrode and the pixel electrode.

The formation of the organic material layer includes: forming an organic material on an entire surface of the insulating film, forming an organic film pattern by exposing and developing the organic material using a half tone mask as the fifth mask, wherein the half tone mask includes a transmitting region corresponding to the gate and data pad lower electrodes, a blocking region corresponding to the data line and the thin film transistor and a semi-transmitting region corresponding to remaining areas, and ashing the organic film pattern to form the organic material layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, with reference to the accompanying drawings, a liquid crystal display device in accordance with the present invention will be described in detail.

Figure 1:
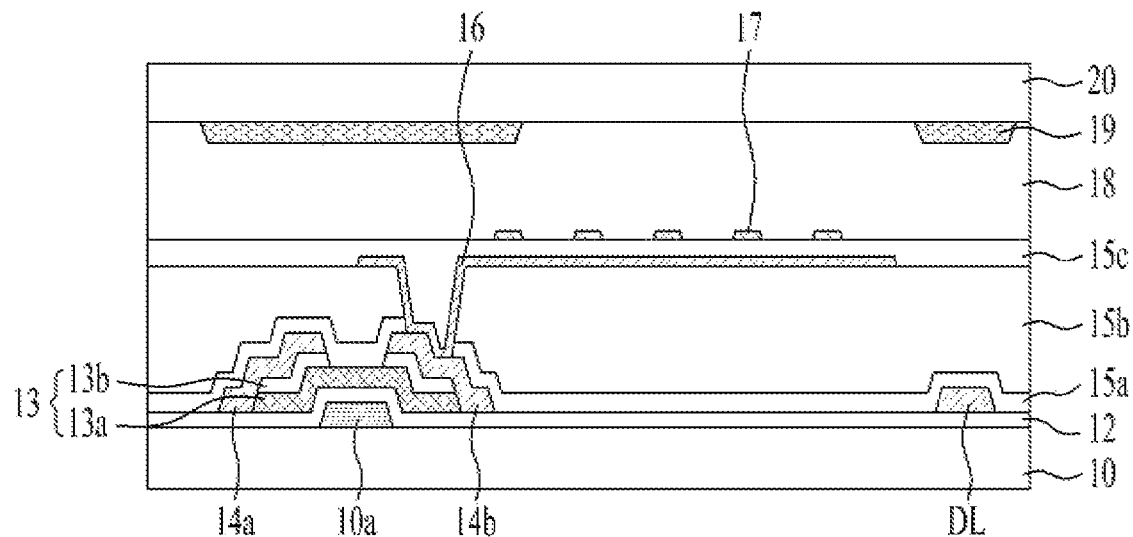
FIG. 1 is a cross-sectional view of a general liquid crystal display device.
Figure 2:
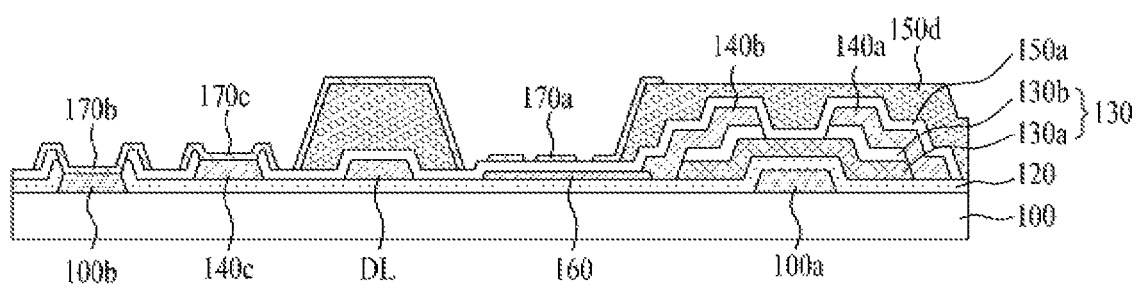
FIG. 2 is a cross-sectional view of a liquid crystal display device in accordance with the present invention.

FIG. 2 is a cross-sectional view of a liquid crystal display device in accordance with the present invention, showing only a thin film transistor substrate.

As shown in FIG. 2, the liquid crystal display device in accordance with the present invention includes gate lines (not shown) and data lines DL perpendicularly intersecting on a substrate 100 having pixel parts and pad parts; thin film transistors formed at the pixel parts of the substrate 100 and including gate electrodes 100a, a gate insulating layer 120, a semiconductor layer 130, source electrodes 140a and drain electrodes 140b; pixel electrodes 160 formed on the gate insulting layer 120 and connected directly to the drain electrodes 140b; an insulating film 150a formed on the overall surface of the substrate 100 to cover the pixel electrodes 160 and the thin film transistors; an organic film 150d exposing the insulating film 150a over the pixel electrode 160, formed on the insulating film 150a over the thin film transistors and the data lines DL and including a light shielding material (not shown); and a plurality of common electrodes 170a of slit shapes overlapping each of the pixel electrodes 160 such that the insulating film 150a is interposed between the common electrodes 170a and each of the pixel electrodes 160.

In more detail, the gate lines (not shown) and the data lines DL perpendicularly intersect each other on the substrate 100 to define the plural pixel parts, and the thin film transistors are formed at the intersections of the gate lines (not shown) and the data lines DL. Further, gate pad lower electrodes 100b connected to the gate lines (not shown) and data pad lower electrodes 140c connected to the data lines DL are formed at the pad parts, and common lines (not shown) and common pads (not shown) connected to the common lines are provided.

Each of the thin film transistors includes the gate electrode 100a, the source electrode 140a and the drain electrode 140b and the semiconductor layer 130 including an active layer 130a and an ohmic contact layer 136 sequentially stacked. Here, the gate electrode 100a may protrude from the gate line (not shown) or may be defined a partial region of the gate line (not shown) so that a scan signal from the gate line (not shown) is supplied to the gate electrode 100a.

The active layer 130a overlaps the gate electrode 100a such that the gate insulating film 120 formed of an inorganic insulating material, such as silicon oxide or silicon nitride, is interposed between the active layer 130a and the gate electrode 100a. The ohmic contact layer 130b formed on the active layer 130a serves to reduce electrical contact resistance between the source and drain electrodes 140a and 140b and the active layer 130a. Further, the ohmic contact layer 130 corresponding to a separation section between the source and drain electrode 140a and 140b, thus forming a channel.

The source electrode 140a is connected to the data line DL and receives a pixel signal from the data line DL, and the drain electrode 140b is formed opposite the source electrode 140a across the channel. Particularly, the pixel electrode 160 of a single electrode shape is formed at the pixel part on the gate insulating film 120.

The pixel electrode 160 is formed of a transparent conductive material, such as tin oxide (TO), indium tin oxide (ITO), indium zinc oxide (IZO) or indium tin zinc oxide (ITZO). Further, the drain electrode 140b is formed to overlap the pixel electrode 160, and contact characteristics between the drain electrode 140b and the pixel electrode 160 are improved by direct contact between the pixel electrode 160 and the drain electrode 140b.

Further, the insulating film 150a formed of a material, such as a silicon nitride ($SiN_x$) film, is provided on the overall surface of the gate insulating film 120 including the source and drain electrodes 140a and 140b, the pixel electrode 160 and the data lines DL. The insulating film 150a exposes the gate pad lower electrodes 100b and the data pad lower electrodes 140c. Then, the organic film 150d formed of a light shielding material is provided on the insulating film 150a. The organic film 150d exposes the insulating film 150a over the pixel electrodes 160 and covers the insulating film 150a over the thin film transistors and the data lines DL.

In more detail, the organic film 150d is formed of an organic material absorbing light and including carbon, titanium oxide ($TiO_x$), a color pigment, etc. or a black-based organic material, for example, a black resin absorbing light. Particularly, if the organic film 150d is formed also on the pixel electrode 160, when liquid crystal molecules of the liquid crystal layer are driven by a fringe field generated between the pixel electrode 160 and the common electrodes 170a therebetween which the insulating film 150a is interposed, stains occur and power consumption increases due to non-uniformity on the upper surface of the organic film 150d.

Particularly, since the organic material absorbing light and including carbon, titanium oxide ($TiO_x$), a color pigment, etc. or the black-based organic material is a photo active compound (PAC), the organic film 150d may be patterned without use of photoresist.

Further, the plural common electrodes 170a of slit shapes overlapping with the pixel electrode 160 under the condition that the insulating film 150a is interposed between the common electrodes 170a and the pixel electrode 160 to form the fringe field with the pixel electrode 160 are formed on the organic film 150d. The common electrodes 170a are also formed of a transparent conductive material, such as tin oxide (TO), indium tin oxide (ITO), indium zinc oxide (IZO) or indium tin zinc oxide (ITZO).

Although not shown in the drawings, R, G and B color filters, column spacers, etc. are formed on a color filter substrate. Therefore, the fringe field is generated between the pixel electrode 160 and the common electrodes 170a therebetween which the insulating film 150a is interposed, the liquid crystal molecules of the liquid crystal layer formed between the thin film transistor substrate and the color filter substrate are rotated due to dielectric anisotropy, and transmittance of light passed through the pixel parts is varied according to a degree of rotation of the liquid crystal molecules, thereby producing an image.

Further, gate pad upper electrodes 170b connected to the gate pad lower electrodes 100b and data pad upper electrodes 170c connected to the data pad lower electrodes 140c are formed of the same layer as the common electrodes 170a.

In the above-described liquid crystal display device in accordance with the present invention, the pixel electrode 160 and the drain electrode 140b contact directly without a pixel contact hole, and thus contact characteristics between the pixel electrode 160 and the drain electrode 140b are improved. Further, since the organic film 150d formed on the insulating film 150a performs the function of a black matrix, a process forming the black matrix on the color filter substrate may be omitted, and thus when the thin film transistor substrate and the color filter substrate are bonded, it is not necessary to consider a bonding margin and thus an aperture ratio may be improved. Further, stains are removed by exposing the insulating film 150a which the pixel electrode 160 and the common electrodes 170a overlap, thus improving display quality and reducing power consumption.

Hereinafter, with reference to the accompanying drawings, a method for fabricating the liquid crystal display device in accordance with the present invention will be described in detail.

FIGS. 3A to 3H are cross-sectional views illustrating a method for fabricating the liquid crystal display device in accordance with the present invention. FIGS. 3A to 3H show only a thin film transistor substrate.

Figure 3A:
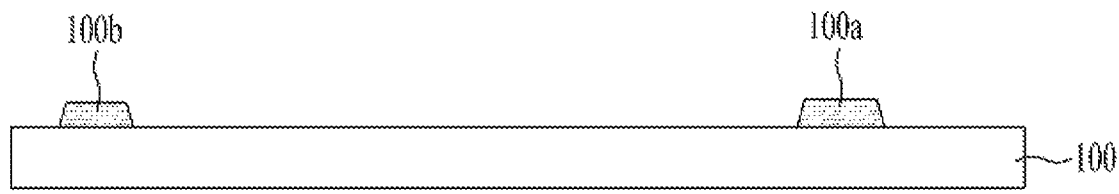
FIGS. 3A to 3H are cross-sectional views illustrating a method for fabricating the liquid crystal display device in accordance with the present invention.

First, as shown in FIG. 3A, the gate electrodes 100a, the gate lines (not shown), the gate pad lower electrodes 100b and the common lines (not shown) are formed on the substrate 100 having the pixel parts and the pad parts using a first mask. In more detail, a metal layer is formed on the substrate 100 through a deposition method, such as sputtering, and then, the gate electrodes 100a, the gate lines (not shown), the gate pad lower electrodes 100b and the common lines (not shown) are formed by patterning the metal layer.

The metal layer may have a structure in which two or more layers are stacked, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al (Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy or Mo/Al alloy, or have a single layer structure, such as Mo, Ti, Cu, AlNd, Al, Cr, a Mo alloy, a Cu alloy or an Al alloy.

Figure 3B:
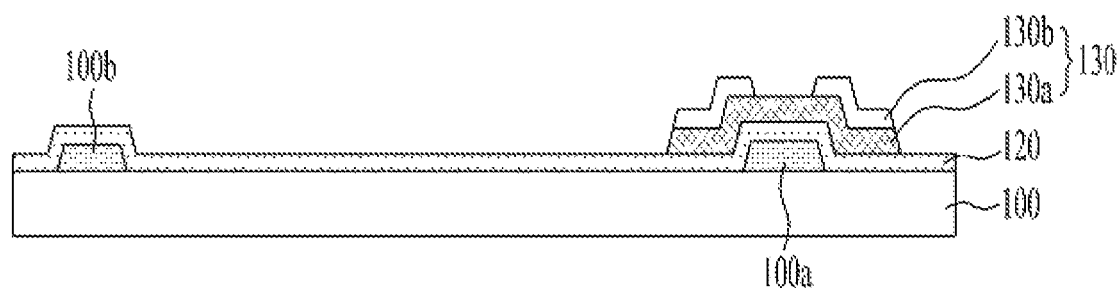

Further, as shown in FIG. 3B, the gate insulating film 120 is formed on the overall surface of the substrate 100 including the gate electrodes 100a, the gate lines (not shown), the gate pad lower electrodes 100b and the common lines (not shown).

Figure 3C:
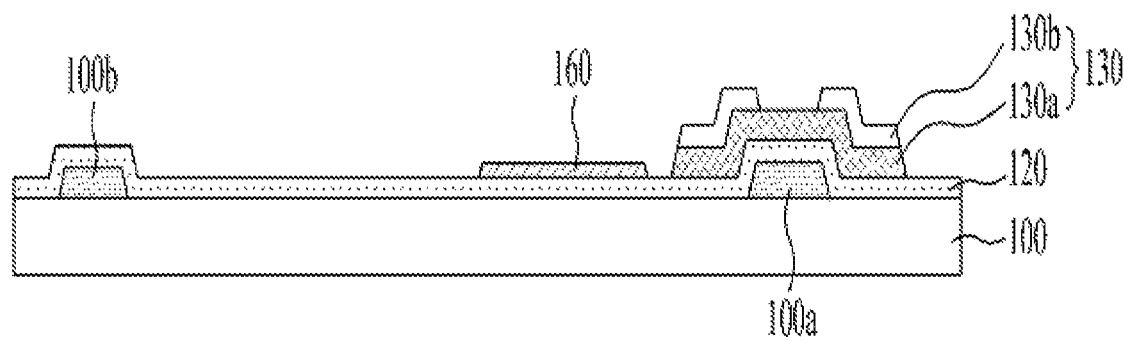

Thereafter, the semiconductor layer 130 is formed on the gate insulating film 120 over the gate electrodes 100a using a second mask. The semiconductor layer 130 has a structure in which the active layer 130a and the ohmic contact layer 130b are sequentially stacked. Thereafter, as shown in FIG. 3C, the pixel electrodes 160 are formed at the pixel parts using a third mask. In more detail, a transparent conductive material layer formed of tin oxide (TO), indium tin oxide (ITO), indium zinc oxide (IZO) or indium tin zinc oxide (ITZO) is provided on the overall surface of the substrate 100 including the semiconductor layer 130, and the pixel electrodes 160, each of which has a single electrode shape, are formed by patterning the transparent conductive material layer.

Figure 3D:
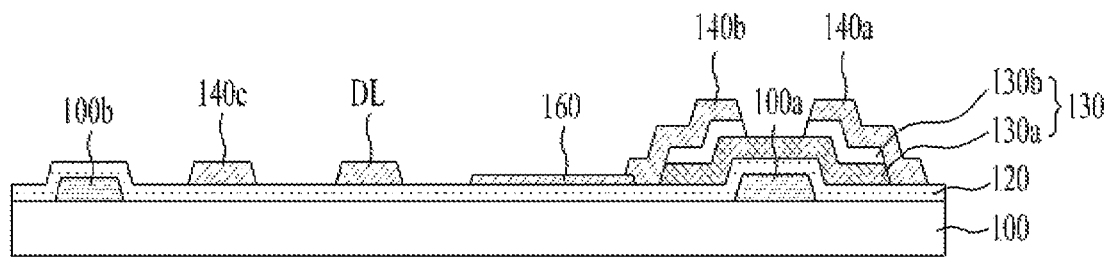

Thereafter, as shown in FIG. 3D, the source and drain electrodes 140a and 140b and the data pad lower electrodes 140c separated from the data lines DL by designated intervals are formed using a fourth mask. Thereby, thin film transistors, each of which includes the gate electrode 100a, the semiconductor layer 130 and the source and drain electrodes 140a and 140b, are formed. The data pad lower electrodes 140c may be formed in the same layer as the data lines DL, as described above, or may be formed simultaneously with the gate pad lower electrodes 100b in the same layer as the gate pad lower electrodes 100b.

Particularly, the drain electrode 140b is formed on a partial region of the pixel electrode 160 so as to overlap with the pixel electrode 160, and thus the drain electrode 140b and the pixel electrode 160 contact directly. Therefore, contact characteristics between the drain electrode 140b and the pixel electrode 160 may be improved, and the number of masks may be reduced by omitting a process of forming pixel contact holes.

Figure 3E:
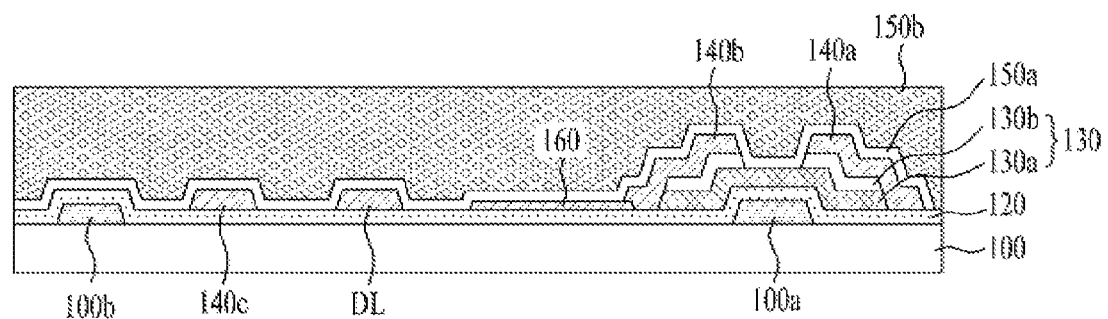

Thereafter, as shown in FIG. 3E, the insulating film 150a is formed on the overall surface of the gate insulating film 120 including the data lines DL, the source and drain electrodes 140a and 140b and the data pad lower electrodes 140c, and an organic material layer 150b is provided on the overall surface of the insulating film 150a. The organic material layer 150b is formed of an organic material absorbing light and includes carbon, titanium oxide ($TiO_x$), a color pigment, etc. or a black-based organic material. For example, the organic material is formed of a black resin absorbing light, and the organic material layer 150b performs the function of a black matrix.

Particularly, since the organic material absorbing light and including carbon, titanium oxide ($TiO_x$), a color pigment, etc. or the black-based organic material is a photo active compound (PAC), the organic material layer 150b may be directly patterned without formation of photoresist on the organic material layer 150b.

In general, a black matrix is formed on a color filter substrate, and in this case, the black matrix is formed through a mask process and thus the mask process is additionally required. Further, when a thin film transistor substrate is bonded to the color filter substrate, a bonding margin between the black matrix and the thin film transistor substrate needs to be considered and thus an aperture ratio may be reduced.

However, in the liquid crystal display device in accordance with the present invention, the organic material layer 150b formed of the organic material absorbing light or the black-based organic material performs the function of the black matrix, and thus the above problem may be prevented.

Figure 3F:
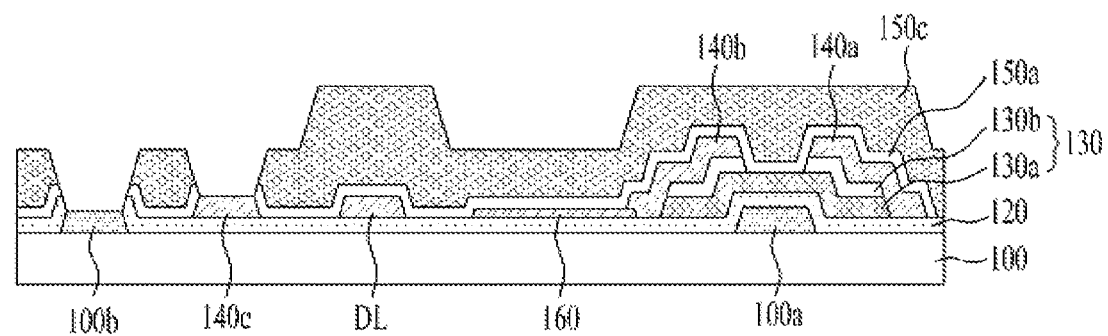

In more detail, a half tone mask serving as a fifth mask is aligned on the organic material layer 150b. Here, the half tone mask includes transmitting regions, blocking regions and semi-transmitting regions. The transmitting regions of the half ton mask correspond to the gate pad lower electrodes 100b and the data pad lower electrodes 140c, the blocking regions correspond to the data lines DL and the thin film transistors, and the semi-transmitting regions correspond to remaining areas. An organic film pattern 150c shown in FIG. 3F is formed by exposing and developing the organic material layer 150b using the half tone mask.

The organic film pattern 150c exposes the insulating film 150a over the gate pad lower electrodes 100b and the data pad lower electrodes 140c. Therefore, gate contact holes are formed by removing the insulating film 150a and the gate insulating film 120 corresponding to the gate pad lower electrodes 100b, and data contact holes are formed by removing the insulating film 150a corresponding to the data pad lower electrodes 140c.

Figure 3G:
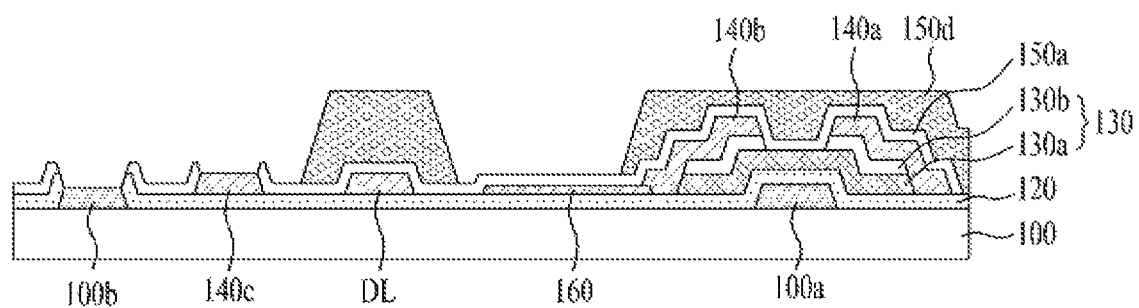

Thereafter, as shown in FIG. 3G, the organic film 150d in which half tone are removed is formed through ashing of the organic film pattern 150c. Thereby, the thickness of the organic film 150d corresponding to the blocking regions after ashing is smaller than the thickness of the organic film pattern 150c corresponding to the blocking regions before ashing.

Figure 3H:
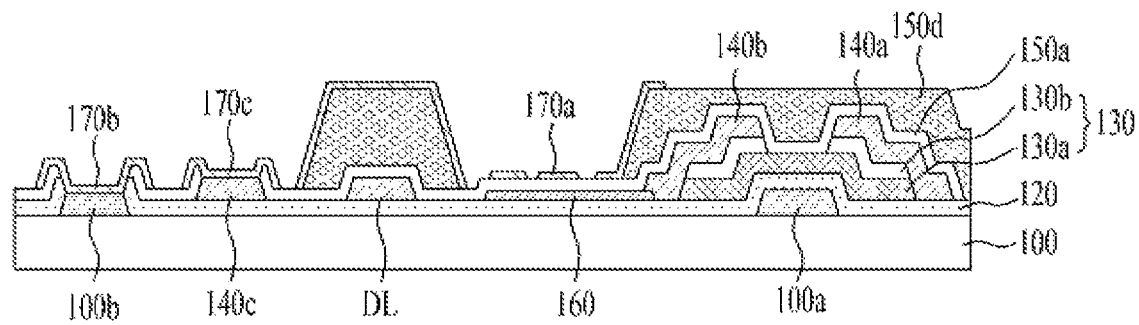

Thereafter, as shown in FIG. 3H, a transparent conductive material layer formed of tin oxide (TO), indium tin oxide (ITO), indium zinc oxide (IZO) or indium tin zinc oxide (ITZO) is provided on the overall surface of a passivation film including the organic film 150d, and the plural common electrodes 170a of slit shapes are formed by patterning the transparent conductive material layer using a sixth mask. The common electrodes 170a overlap the pixel electrode 160 at the pixel part such that the insulating film 150a is interposed between the common electrodes 170a and the pixel electrode 160, thus generating a fringe field.

Simultaneously, the gate pad upper electrodes 170b connected to the gate pad lower electrodes 100b through the gate contact holes and the data pad upper electrodes 170c connected to the data pad lower electrodes 140c through the data contact holes are formed.

A general organic film is formed to cover thin film transistors, data lines and pixel electrodes, and in this case, stains may be generated and power consumption may be increased due to the non-uniform thickness of the organic film.

In more detail, an insulating film formed to cover gate pad lower electrodes and data pad lower electrodes is patterned using the organic film as a mask, thus exposing the gate pad lower electrodes and the data pad lower electrodes. However, during a dry etching process for patterning the insulating film, etching gas removes parts of the organic film also, and thus the upper surface of the organic film may be non-uniform.

Further, since the organic film in accordance with the present invention is patterned using the half tone mask, the non-uniform upper surface of the organic film during an ashing process may generate stains if the pixel electrode and the common electrodes form a fringe field under the condition that the insulating film and the organic film is interposed between the pixel electrode and the common electrodes.

However, in the present invention, since the organic film performing the function of the black matrix is formed on the thin film transistor substrate and exposes the insulating film corresponding to the pixel electrodes, as described above, generation of stains is prevented and power consumption is reduced. Further, the number of masks is reduced by omitting the mask process forming the black matrix, and thus the fabricating process of the liquid crystal display device may be simplified and the manufacturing cost of the liquid crystal display device may be reduced. Thereby, when the thin film transistor substrate and the color filter substrate are bonded, consideration of a bonding margin is not required, and thus an aperture ratio is improved.

The above-described liquid crystal display device and method for fabricating the same in accordance with the present invention have the following effects.

First, the pixel electrode and the drain electrode contact directly without a pixel contact hole and thus contact characteristics between the pixel electrode and the drain electrode may be improved, and a process for forming pixel contact holes is omitted and thus the number of masks may be reduced.

Second, the organic film performing the function of a black matrix is formed on the thin film transistor substrate and thus the number of masks may be reduced, and consideration of a bonding margin is not required when the thin film transistor substrate and the color filter substrate are bonded and thus an aperture ratio may be improved.

Third, the organic film including a light shielding material exposes the insulating film corresponding to the pixel electrodes, and thus stains may be removed to improve a display quality and power consumption may be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a liquid crystal display device comprising:

forming a gate line, a gate electrode and a gate pad lower electrode on a substrate using a first mask;

forming a gate insulating layer on an entire surface of the substrate including the gate line, the gate electrode and the gate pad lower electrode;

forming a semiconductor layer on the gate insulating layer over the gate electrode using a second mask;

forming a pixel electrode on the gate insulating layer using a third mask;

forming a data line and a data pad lower electrode on the gate insulating layer, and a source electrode and a drain electrode separated from the source electrode and connected directly to the pixel electrode on the semiconductor layer using a fourth mask, thereby forming a thin film transistor including the gate electrode and the source and drain electrodes;

forming an insulating film on an entire surface of the substrate including the data line and the source and drain electrodes;

forming an organic material on an entire surface of the insulating film;

exposing and developing the organic material to form an organic film pattern by using a half tone mask as a fifth mask, wherein the half tone mask includes a transmitting region corresponding to the gate and data pad lower electrodes, a blocking region corresponding to the data line and the thin film transistor and a semi-transmitting region corresponding to remaining areas, wherein the organic film pattern exposes the insulating film over the gate and data pad lower electrodes;

removing the exposed insulating film to form contact holes on the gate and data pad lower electrodes;

ashing the organic film pattern to form an organic material layer over the thin film transistor and the data line; and forming a common electrode of slit shapes on the substrate to overlap with the pixel electrode using a sixth mask such that the insulating film is interposed between the common electrode and the pixel electrode, wherein the organic material layer is formed of a light shielding material.

2. The method according to claim 1, further comprising:

forming a gate pad upper electrode connected to the gate pad lower electrode, and a data pad upper electrode connected to the data pad lower electrode, wherein the gate pad upper electrode and the data pad upper electrode are formed of the same layer as the common electrode.

3. The method according to claim 1, wherein the organic material layer includes at least one selected from the group consisting of carbon, titanium oxide, a color pigment and a black resin.

4. The method according to claim 1, wherein the organic material layer is formed of a photo active compound (PAC).

* * * * *